US012772538B2

(12) United States Patent
Beppu et al.

(10) Patent No.: US 12,772,538 B2
(45) Date of Patent: Oct. 20, 2026

(54) THREE-DIMENSINAL SEMICONDUCTOR MEMORY DEVICE AND METHOD OF MANUFACTURING THE SAME

(71) Applicant: Kioxia Corporation, Tokyo (JP)

(72) Inventors: Takayuki Beppu, Yokkaichi Mie (JP); Hiroko Tahara, Yokkaichi Mie (JP); Masayuki Kitamura, Yokkaichi Mie (JP); Hiroshi Toyoda, Kamakura Kanagawa (JP); Hiroyuki Ohtori, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 446 days.

(21) Appl. No.: 18/463,348

(22) Filed: Sep. 8, 2023

(65) Prior Publication Data

US 2024/0178298 A1 May 30, 2024

(30) Foreign Application Priority Data

Nov. 30, 2022 (JP) ................................ 2022-191519

(51) Int. Cl.
*H10D 64/66* (2025.01)
*H10B 41/27* (2023.01)
*H10B 43/27* (2023.01)
*H10W 20/41* (2026.01)

(52) U.S. Cl.
CPC ........... *H10D 64/665* (2025.01); *H10B 41/27* (2023.02); *H10B 43/27* (2023.02); *H10W 20/435* (2026.01)

(58) Field of Classification Search
CPC . H10D 64/665; H10W 20/435; H10W 20/083
See application file for complete search history.

(56) References Cited

U.S. PATENT DOCUMENTS

| | | | |
|---|---|---|---|
| 5,929,524 A | 7/1999 | Drynan et al. | |
| 6,277,730 B1 | 8/2001 | Yuasa et al. | |
| 6,346,480 B2 | 2/2002 | Yamamoto et al. | |
| 10,930,493 B2 | 2/2021 | Roy et al. | |
| 2018/0247821 A1 | 8/2018 | Chen et al. | |
| 2020/0027738 A1* | 1/2020 | Chen | H10P 14/3411 |
| 2020/0091080 A1* | 3/2020 | Wakatsuki | H10D 64/037 |
| 2021/0083057 A1* | 3/2021 | Kitamura | H10D 64/667 |
| 2021/0265372 A1* | 8/2021 | Kanakamedala | H10B 41/10 |
| 2021/0265385 A1* | 8/2021 | Rajashekhar | H10B 41/35 |

FOREIGN PATENT DOCUMENTS

| | | |
|---|---|---|
| JP | H09167795 A | 6/1997 |
| JP | 3322305 B2 | 9/2002 |
| JP | 2011-086837 A | 4/2011 |
| JP | 3215382 U | 2/2018 |
| JP | 2022505844 A | 1/2022 |

* cited by examiner

*Primary Examiner* — William B Partridge
*Assistant Examiner* — Chevy J Boegel
(74) *Attorney, Agent, or Firm* — Maier & Maier, PLLC

(57) ABSTRACT

In one embodiment, a semiconductor device includes a first layer including a metal element. The device further includes a first insulator that is in contact with the first layer and includes silicon and oxygen. The device further includes a second layer that is in contact with the first insulator and includes molybdenum or tungsten.

16 Claims, 14 Drawing Sheets

THREE-DIMENSINAL SEMICONDUCTOR MEMORY DEVICE AND METHOD OF MANUFACTURING THE SAME

CROSS REFERENCE TO RELATED APPLICATION

This application is based upon and claims the benefit of priority from the prior Japanese Patent Application No. 2022-191519, filed on Nov. 30, 2022, the entire contents of which are incorporated herein by reference.

FIELD

Embodiments described herein relate to a semiconductor device and a method of manufacturing the same.

BACKGROUND

When first and second layers including metal elements are sequentially formed, the second layer is not favorably formed in some cases due to an influence of the first layer. For example, when an electrode material layer is formed on a surface of a block insulator or a barrier metal layer to form an electrode layer (word line) of a three-dimensional semiconductor memory, an electrical resistance of the electrode material layer becomes high in some cases due to an influence of crystallinity of the block insulator or the barrier metal layer and the like.

DETAILED DESCRIPTION

Figure 1:
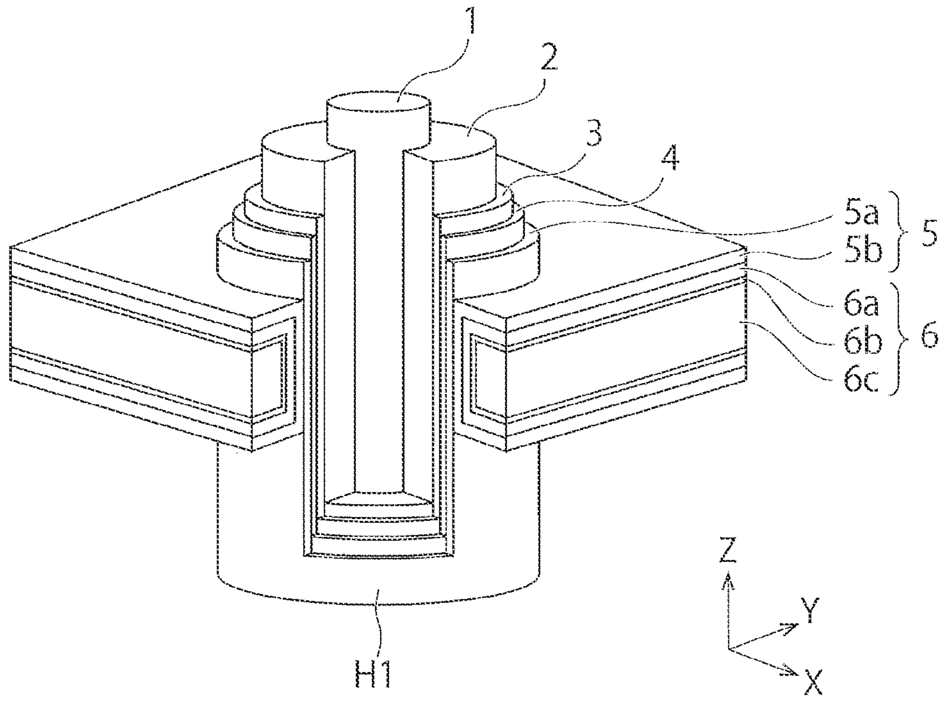
FIG. 1 is a perspective view illustrating a structure of a semiconductor device of a first embodiment.

Embodiments will now be explained with reference to the accompanying drawings. In FIGS. 1 to 14, the same reference numeral is used to refer to the same components and a redundant description is omitted.

In one embodiment, a semiconductor device includes a first layer including a metal element. The device further includes a first insulator that is in contact with the first layer and includes silicon and oxygen. The device further includes a second layer that is in contact with the first insulator and includes molybdenum or tungsten.

First Embodiment

FIG. 1 is a perspective view illustrating a structure of a semiconductor device of a first embodiment. The semiconductor device of the present embodiment includes, for example, a three-dimensional semiconductor memory.

The semiconductor device of the present embodiment includes a core insulator 1, a channel semiconductor layer 2, a tunnel insulator 3, a charge storing layer 4, a block insulator 5, and an electrode layer 6. The block insulator 5 includes an insulator 5*a* and an insulator 5*b*. The electrode layer 6 includes a barrier metal layer 6*a*, an insulator 6*b*, and an electrode material layer 6*c*. The insulator 5*b* and the barrier metal layer 6*a* are examples of the first layer. The insulator 6*b* is an example of the first insulator. The electrode material layer 6*c* is the second layer. The electrode layer 6 is an example of a first interconnect layer.

In FIG. 1, a plurality of electrode layers and a plurality of insulators are alternately stacked on a substrate and a memory hole H1 is made in these electrode layers and insulators. FIG. 1 illustrates one electrode layer 6 among these electrode layers. These electrode layers function as, for example, word lines of the three-dimensional semiconductor memory. FIG. 1 illustrates an X direction and a Y direction that are parallel with a surface of the substrate and perpendicular to each other and a Z direction perpendicular to the surface of the substrate. A +Z direction is treated as an upper direction and a −Z direction is treated as a lower direction herein. The −Z direction may be in alignment with a gravity direction or not in alignment with the gravity direction.

The core insulator 1, the channel semiconductor layer 2, the tunnel insulator 3, the charge storing layer 4, and the insulator 5*a* are formed in the memory hole H1 and provide a memory cell of the three-dimensional semiconductor memory. The insulator 5*a* is formed on side faces of the electrode layers and the insulators in the memory hole H1 and the charge storing layer 4 is formed on a side face of the insulator 5*a*. The charge storing layer 4 is able to store a signal charge of the three-dimensional semiconductor memory. The tunnel insulator 3 is formed on a side face of the charge storing layer 4 and the channel semiconductor layer 2 is formed on a side face of the tunnel insulator 3. The channel semiconductor layer 2 functions as a channel of the three-dimensional semiconductor memory. The core insulator 1 is formed on a side face of the channel semiconductor layer 2.

The insulator 5*a* is, for example, an $SiO_2$ film (silicon oxide film). The charge storing layer 4 is, for example, an SiN film (silicon nitride film). The tunnel insulator 3 is, for example, an $SiO_2$ film. The channel semiconductor layer 2 is, for example, a polysilicon layer. The core insulator 1 is, for example, an $SiO_2$ film.

The insulator 5*b*, the barrier metal layer 6*a*, the insulator 6*b*, and the electrode material layer 6*c* are formed between two of the plurality of insulators and formed on a lower face of the upper insulator, an upper face of the lower insulator, and the side face of the insulator 5*a* in sequence. The barrier metal layer 6*a* is in contact with the insulator 5*b*, the insulator 6*b* is in contact with the barrier metal layer 6*a*, and the electrode material layer 6*c* is in contact with the insulator

6b. In the present embodiment, the insulator 5b is an insulator including a metal element and the barrier metal layer 6a and the electrode material layer 6c are each a conductor layer including a metal element. The semiconductor device of the present embodiment may include no barrier metal layer 6a between the insulator 5b and the insulator 6b. In this case, the insulator 6b is in contact with the insulator 5b.

The insulator 5b is, for example, an $Al_2O_3$ film (aluminum oxide film). The barrier metal layer 6a is, for example, a TiN film (titanium nitride film). The insulator 6b is, for example, an $SiO_2$ film or an $SiO_x$ film ("x" is a real number satisfying 0<"x"<2). The electrode material layer 6c is, for example, an Mo (molybdenum) layer or a W (tungsten) layer. Aluminum and titanium are examples of a first metal element. Molybdenum and tungsten are examples of a second metal element different from the first metal element.

The electrode layer 6 of the present embodiment includes the insulator 6b between the barrier metal layer 6a and the electrode material layer 6c. The insulator 6b is in a form not preventing the electrode layer 6 from functioning as a word line and has, for example, a not extremely large thickness. The thickness of the insulator 6b is, for example, 7 nm or less. In addition, a concentration of oxygen atoms in the insulator 6b is, for example, in a range from $5.0\times10^{21}$ to $5.0\times10^{23}$ atoms/$cm^3$. A further detail of the insulator 6b will be described later.

FIGS. 2 to 5 are cross-sectional views illustrating a method of manufacturing the semiconductor device of the first embodiment.

Figure 2:
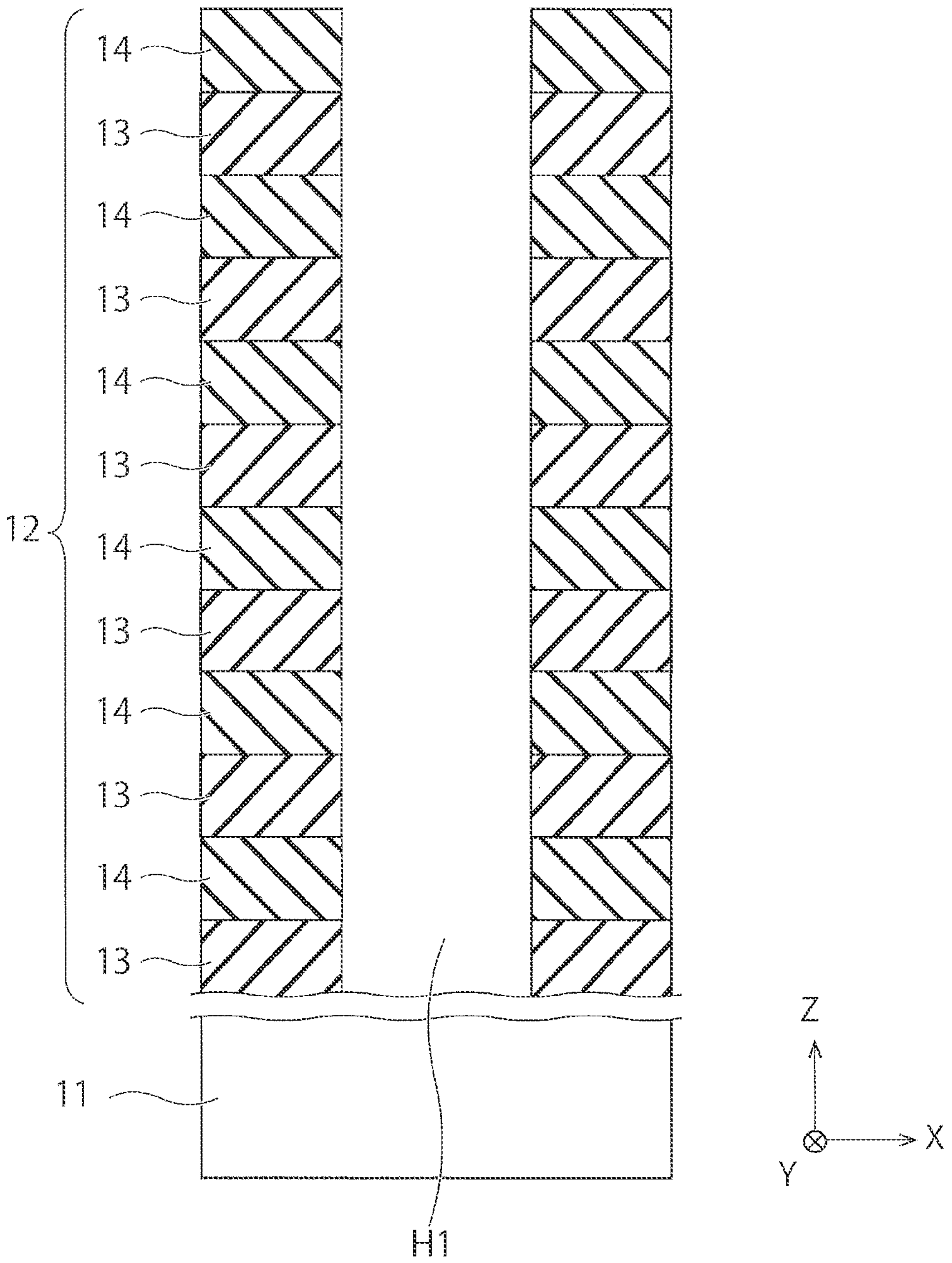
FIGS. 2 to 5 are cross-sectional views illustrating a method of manufacturing the semiconductor device of the first embodiment.

First, a substrate 11 is prepared and a stacked film 12 is formed on the substrate 11 (FIG. 2). The stacked film 12 is formed by alternately stacking a plurality of sacrifice layers 13 and a plurality of insulators 14 on the substrate 11. The stacked film 12 may be formed directly on the substrate 11 or may be formed on the substrate 11 with another layer in between. The substrate 11 is, for example, a semiconductor substrate such as an Si (silicon) substrate. The sacrifice layers 13 are, for example, SiN films. The insulators 14 are, for example, $SiO_2$ films.

Next, a plurality of memory holes H1 are formed in the stacked film 12 by photolithography and RIE (Reactive Ion Etching) (FIG. 2). FIG. 2 illustrates one of these memory holes H1.

Figure 3:
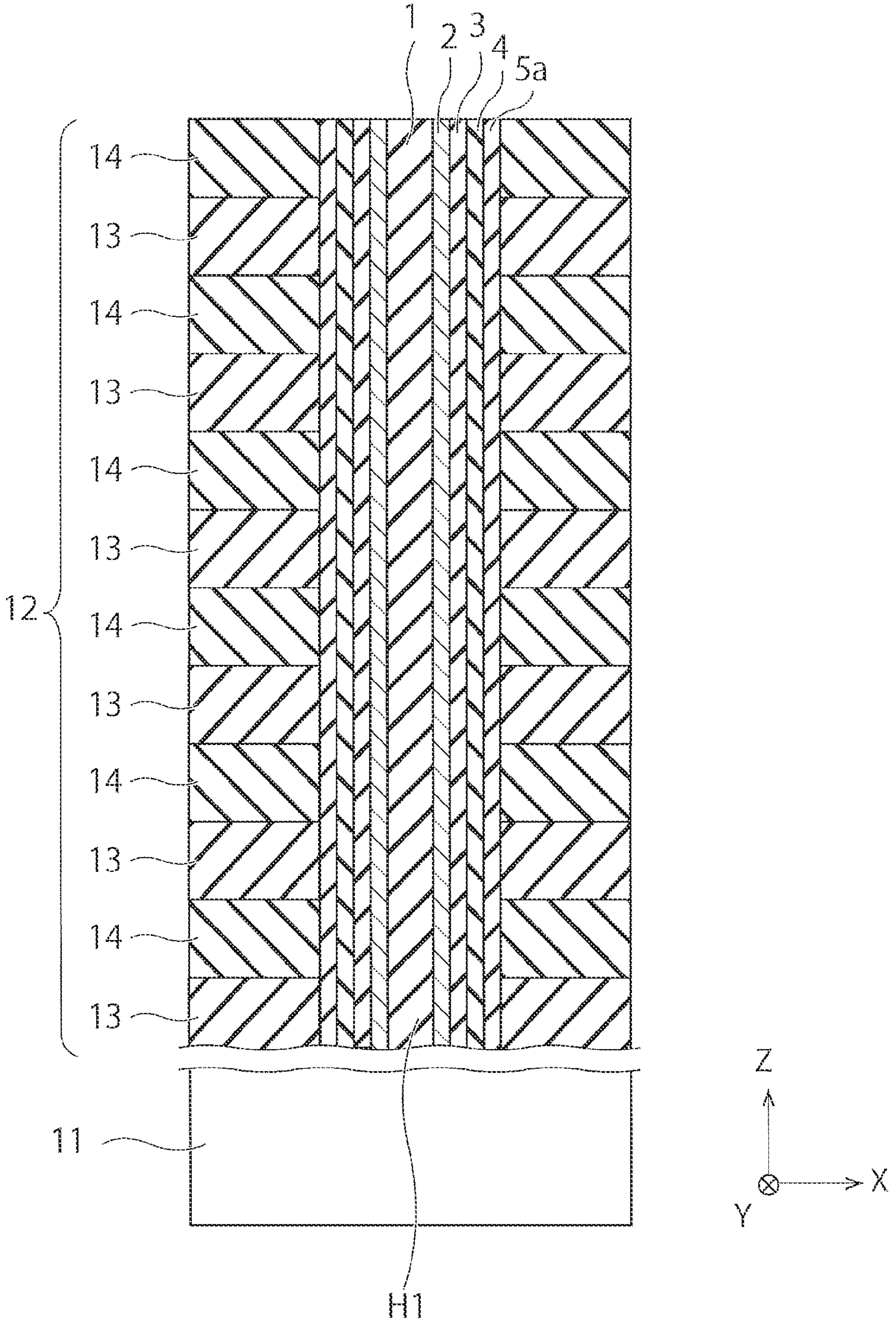
Figure 4:
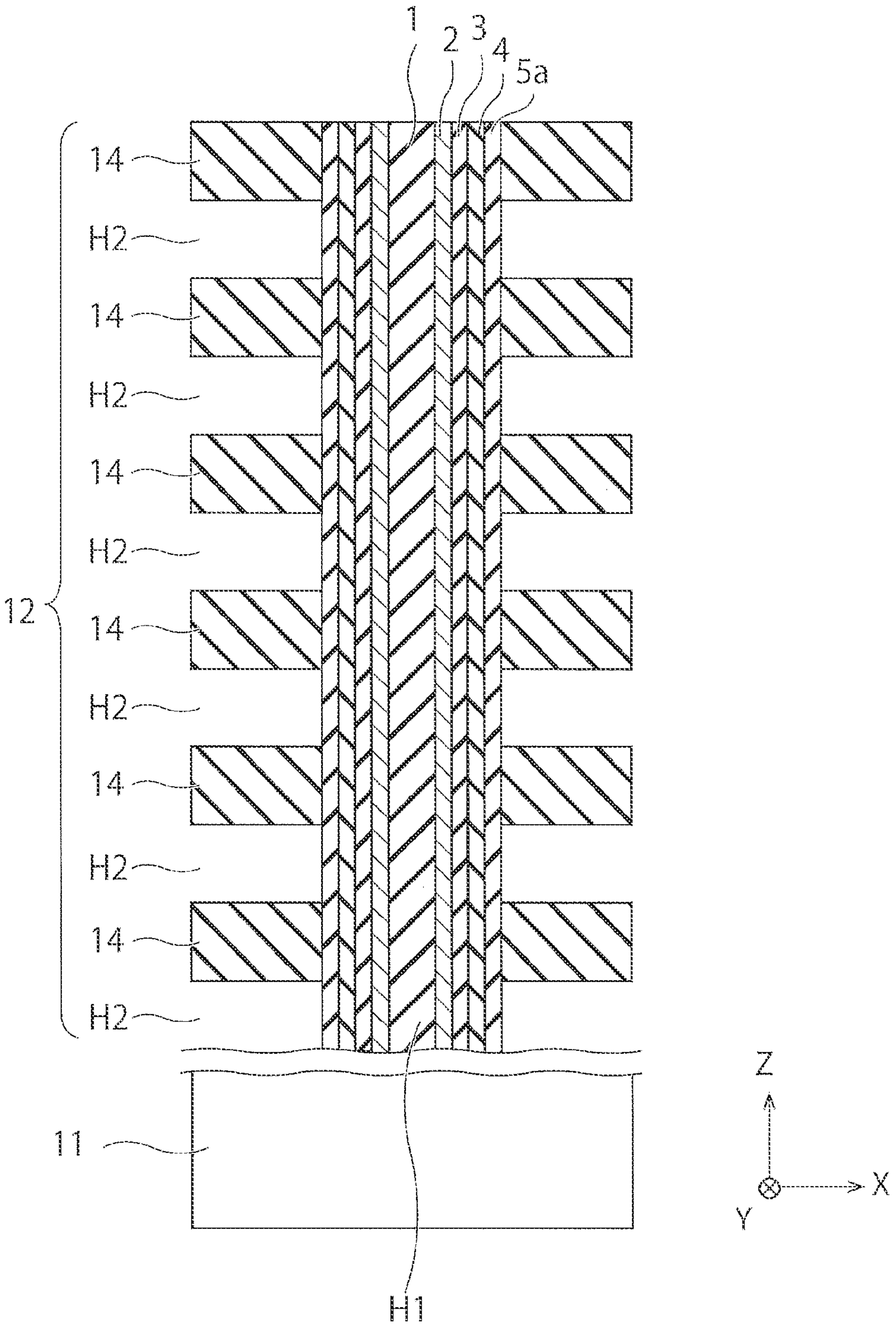

Next, the insulator 5a, the charge storing layer 4, the tunnel insulator 3, the channel semiconductor layer 2, and the core insulator 1 are sequentially formed on a side face of the stacked film 12 in each of the memory holes H1 (FIG. 3). Next, a plurality of slits (not illustrated) are formed in the stacked film 12 and the sacrifice layers 13 are removed by applying wet etching through the slits (FIG. 4). As a result, a plurality of recesses H2 are formed in the stacked film 12.

Figure 5:
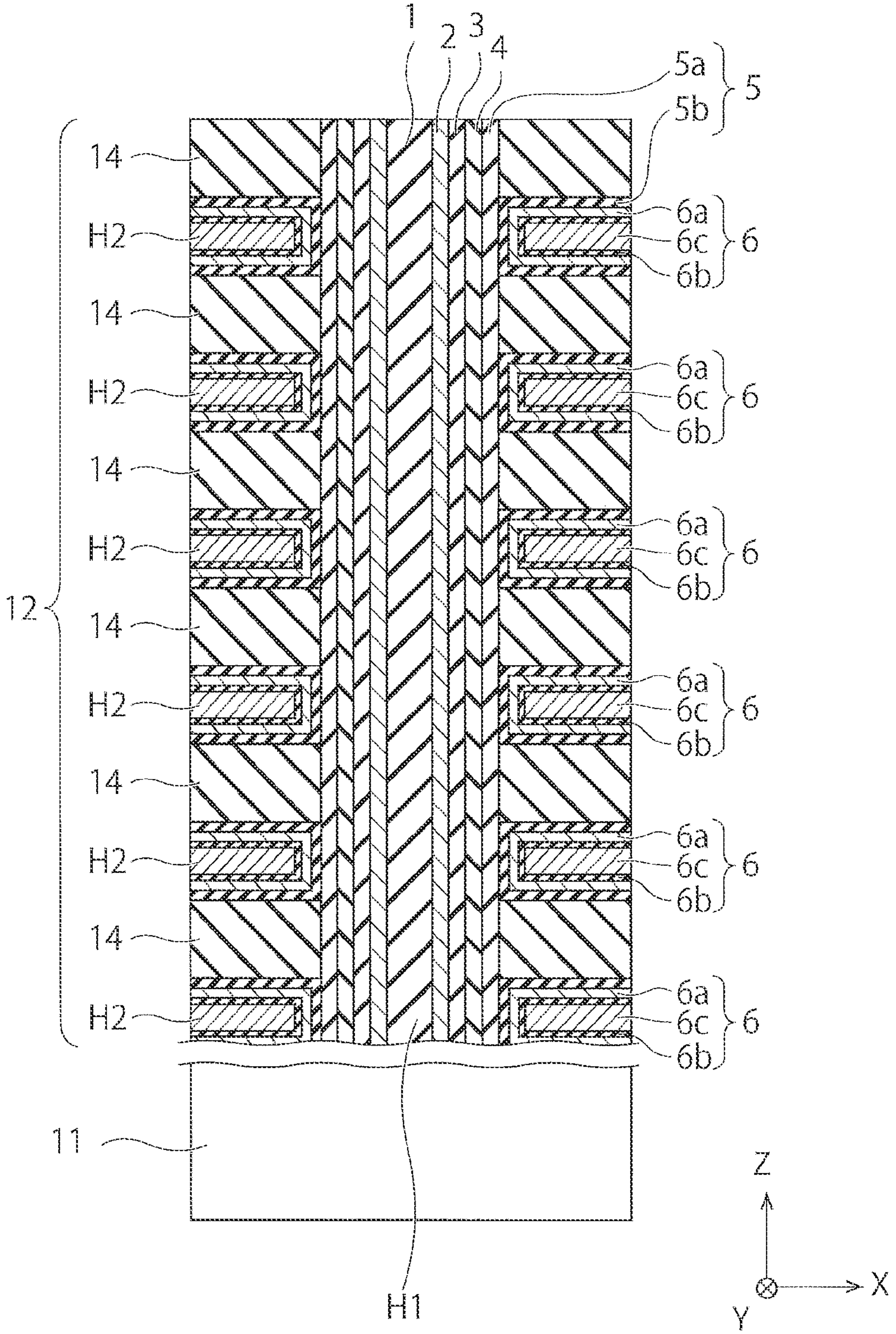

Next, the insulator 5b, the barrier metal layer 6a, the insulator 6b, and the electrode material layer 6c are sequentially formed on surfaces of the insulators 5a, 14 in each of the recesses H2 (FIG. 5). As a result, the block insulator 5 including the insulators 5a, 5b is formed. Further, the electrode layer 6 including the barrier metal layer 6a, the insulator 6b, and the electrode material layer 6c is formed in each of the recesses H2. Further, the stacked film 12 alternately including the plurality of electrode layers 6 and the plurality of insulators 14 is formed on the substrate 11. A thickness of the insulator 6b is, for example, set in a range from 1 to 7 nm.

The semiconductor device of the present embodiment is manufactured as described in the foregoing (FIG. 5). FIG. 1 illustrates a part of the semiconductor device in FIG. 5.

Next, the first embodiment and a comparative example of the first embodiment are compared with reference to FIGS. 6A to 12B.

Figure 6A:
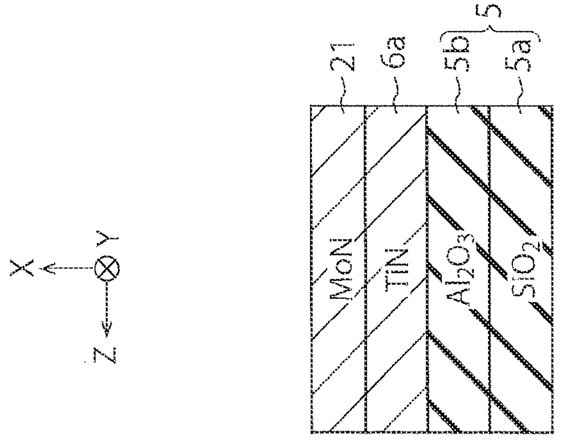
FIGS. 6A to 6C are cross-sectional views illustrating a method of manufacturing a semiconductor device of a comparative example of the first embodiment.
Figure 6B:
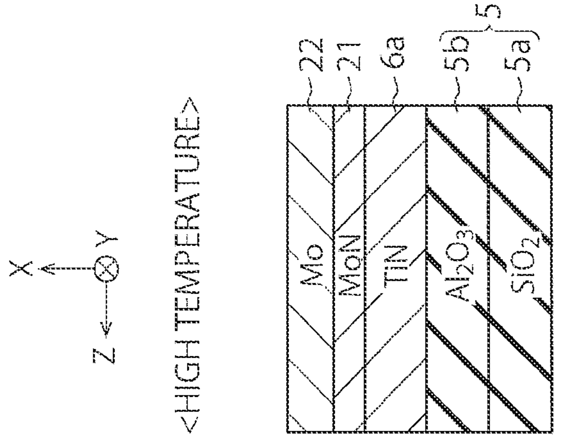
Figure 6C:
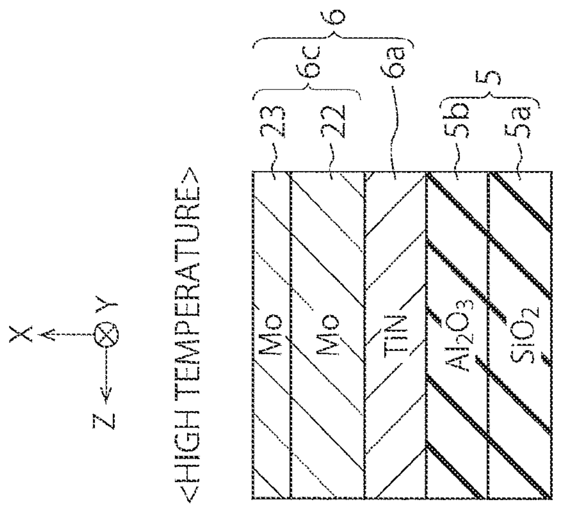

FIGS. 6A to 6C are cross-sectional views illustrating a method of manufacturing a semiconductor device of the comparative example of the first embodiment. FIGS. 6A to 6C illustrate a method of forming the electrode layer 6 on a surface of the block insulator 5.

First, the barrier metal layer 6a is formed on a surface of the insulator 5b and an MON film (molybdenum nitride film) 21 is formed on a surface of the barrier metal layer 6a (FIG. 6A). The MON film 21 is formed by, for example, CVD (Chemical Vapor Deposition) such as ALD (Atomic Layer Deposition) at 300° C.

Next, Mo conversion is performed that changes at least a portion of the MoN film 21 into an Mo film (molybdenum film) 22 (FIG. 6B). In FIG. 6B, a portion of the MoN film 21 is changed into the Mo film 22, and the remnant of the MON film 21 remains as the MON film 21, which results in forming the Mo film 22 on a surface of the MON film 21. The Mo conversion in FIG. 6B is performed by, for example, heating the MON film 21 at 614° C.

Next, an Mo film 23 is formed on a surface of the Mo film 22 (FIG. 6C). In FIG. 6C, the Mo conversion further progresses at the time of formation of the Mo film 23 on the surface of the Mo film 22. As a result, the MoN film 21 is fully changed into the Mo film 22, causing the electrode material layer 6c including the Mo films 22, 23 to be formed on the surface of the barrier metal layer 6a. The Mo film 23 is formed by, for example, CVD such as ALD at 614° C.

Formation of an Mo film directly on the surface of the barrier metal layer 6a reduces a particle size of crystal particles in the Mo film due to an influence of crystallinity of the barrier metal layer 6a, causing an electrical resistance of the Mo film to be high. Accordingly, in the present comparative example, the MON film 21 (initial film) is formed on the surface of the barrier metal layer 6a, the Mo film 22 is formed from the MON film 21, and the Mo film 23 is formed on the surface of the Mo film 22. This makes it possible to reduce the influence of the crystallinity of the barrier metal layer 6a on the Mo films 22, 23 to increase the particle size of the crystal particles in the Mo films 22, 23. However, in the present comparative example, nitrogen atoms separate from the MON film 21 and the nitrogen atoms enter the Mo film 23 during formation of the Mo film 23. This worsens a roughness of the Mo film 23 to increase an electrical resistance of the Mo film 23.

Figures 7A, 7B, 7C:
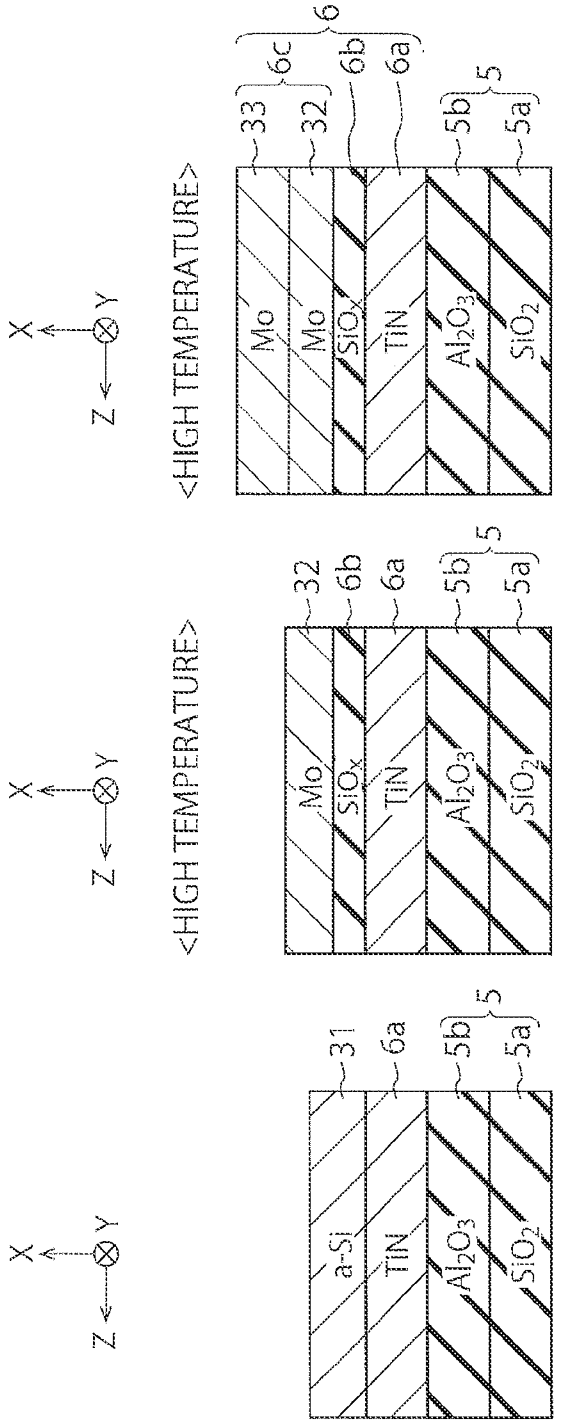
FIGS. 7A to 7C are cross-sectional views illustrating an example of the method of manufacturing the semiconductor device of the first embodiment.

FIGS. 7A to 7C are cross-sectional views illustrating an example of the method of manufacturing the semiconductor device of the first embodiment. FIGS. 7A to 7C also illustrate a method of forming the electrode layer 6 on the surface of the block insulator 5.

First, the barrier metal layer 6a is formed on the surface of the insulator 5b, and an a-Si film (amorphous silicon film) 31 is formed on the surface of the barrier metal layer 6a (FIG. 7A). The a-Si film 31 is formed by, for example, CVD such as ALD at 500° C. A thickness of the a-Si film 31 is, for example, 7 nm or less. The a-Si film 31 is an example of a first film. In FIG. 7A, the a-Si film 31 is in contact with the barrier metal layer 6a. In a case where no barrier metal layer 6a is formed, the a-Si film 31 is caused to be in contact with the insulator 5b. In FIG. 7A, a silicon film (for example, polysilicon film) that is not amorphous may be used in place of the a-Si film 31.

Next, Mo conversion is performed that changes at least a portion of the a-Si film 31 into an Mo film 32 (FIG. 7B). In FIG. 7B, the portion of the a-Si film 31 is changed into the Mo film 32, and the remnant of the a-Si film 31 is changed into the insulator ($SiO_x$ film) 6*b*, which results in forming the Mo film 32 on a surface of the insulator 6*b*. The Mo conversion in FIG. 7B is performed by, for example, heating the a-Si film 31 at 614° C. using a source gas including molybdenum and oxygen. A thickness of the Mo film 32 is, for example, 5 nm or less. The Mo film 32 is an example of the second film. In FIG. 7B, the insulator 6*b* is in contact with the barrier metal layer 6*a* and the Mo film 32 is in contact with the insulator 6*b*. The insulator 6*b* may be an $SiO_2$ film in place of the $SiO_x$ film.

Next, an Mo film 33 is formed on a surface of the Mo film 32 (FIG. 7C). As a result, the electrode material layer 6*c* including the Mo films 32, 33 is formed on the surface of the insulator 6*b*. The Mo film 33 is formed by, for example, CVD such as ALD at 614° C. A thickness of the Mo film 33 is set, for example, larger than the thickness of the Mo film 32. The Mo film 33 is an example of a third film. In FIG. 7C, the Mo film 33 is in contact with the Mo film 32.

Formation of an Mo film directly on the surface of the barrier metal layer 6*a* reduces a particle size of crystal particles in the Mo film due to an influence of crystallinity of the barrier metal layer 6*a*, causing an electrical resistance of the Mo film to be high. Accordingly, in the present embodiment, the a-Si film 31 (initial film) is formed on the surface of the barrier metal layer 6*a*, the Mo film 32 and the insulator 6*b* are formed from the a-Si film 31, and the Mo film 33 is formed on the surface of the Mo film 32. This makes it possible to reduce the influence of the crystallinity of the barrier metal layer 6*a* on the Mo films 32, 33 to increase the particle size of the crystal particles in the Mo films 32, 33. Additionally, in the present embodiment, the a-Si film 31 is used as the initial film in place of the MoN film 21 to form the Mo films 32, 33. This makes it possible to keep nitrogen atoms from worsening a roughness of the Mo film 33 and lower an electrical resistance of the Mo film 33.

In the present embodiment, silicon in the insulator 6*b* originates from silicon in the a-Si film 31 and oxygen in the insulator 6*b* originates from oxygen in the source gas. The source gas is, for example, an $MoO_2Cl_2$ gas or an $MoOCl_4$ gas (Cl denotes chlorine). The source gas is an example of a first gas. In a case where a W (tungsten) film is to be formed in place of the Mo film 32 and a W film is to be formed in place of the Mo film 33, the source gas is, for example, a $WO_2Cl_2$ gas or a $WOCl_4$ gas.

Figure 8C:
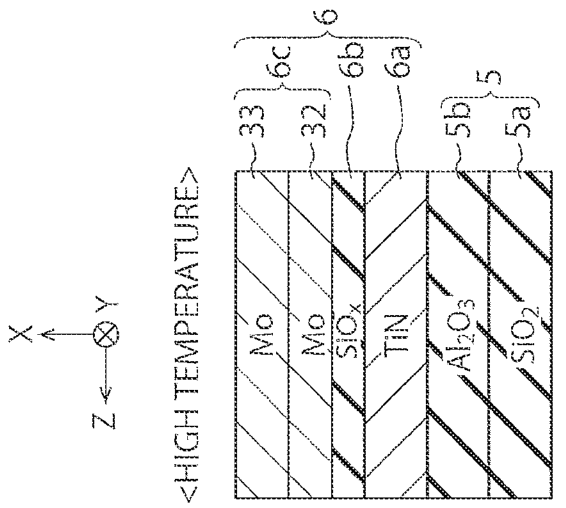
FIGS. 8A to 8C are cross-sectional views illustrating another example of the method of manufacturing the semiconductor device of the first embodiment.
Figure 8B:
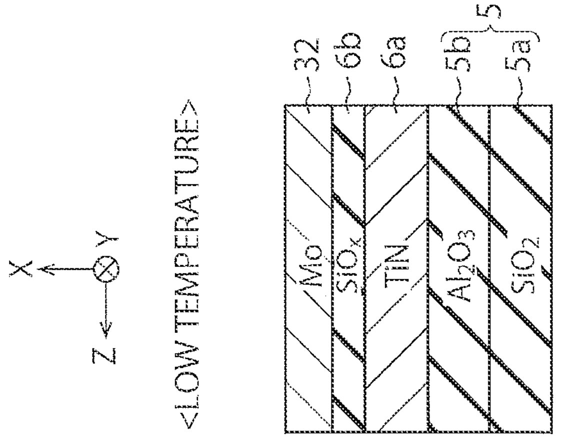
Figure 8A:
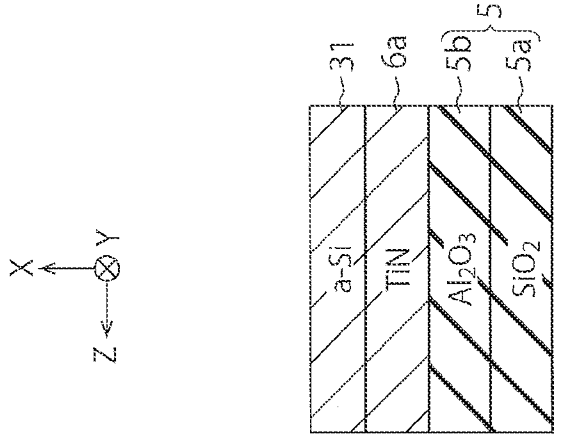

FIGS. 8A to 8C are cross-sectional views illustrating another example of the method of manufacturing the semiconductor device of the first embodiment. FIGS. 8A to 8C also illustrate a method of forming the electrode layer 6 on the surface of the block insulator 5.

Processes in FIGS. 8A to 8C are performed as in the processes in FIGS. 7A to 7C, respectively. Whereas the Mo conversion in FIG. 7B is performed at a high temperature, Mo conversion in FIG. 8B is performed at a low temperature. The Mo conversion in FIG. 8B is performed by, for example, heating the a-Si film 31 at a temperature (e.g., 350° C.) equal to or lower than 600° C. using a source gas including molybdenum and oxygen. In FIG. 8C, the Mo film 33 is formed at, for example, a temperature (e.g., 614° C.) higher than the temperature of the Mo conversion.

In the present embodiment, the Mo conversion is performed at a low temperature, which makes it possible to improve a roughness of the Mo film 32 and, consequently, further improve the roughness of the Mo film 33. Therefore, the present embodiment makes it possible to further reduce an electrical resistance of the electrode material layer 6*c*.

In a case where a W film is to be formed in place of the Mo film 32 and a W film is to be formed in place of the Mo film 33, W conversion is performed in place of the Mo conversion. The W conversion, which may be performed at a high temperature or a low temperature, is desirably performed at a low temperature. The W conversion is performed by, for example, heating the a-Si film 31 at a temperature in a range from 400 to 500° C. using a source gas including tungsten and oxygen. In this case, the W film, which replaces the Mo film 33, is formed at, for example, a higher temperature than the temperature of the W conversion.

Figure 9B:
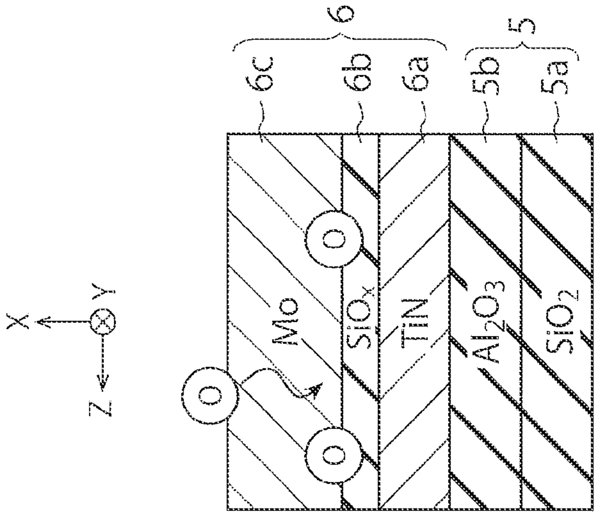
FIGS. 9A and 9B are cross-sectional views for describing an advantage of the semiconductor device of the first embodiment.
Figure 9A:
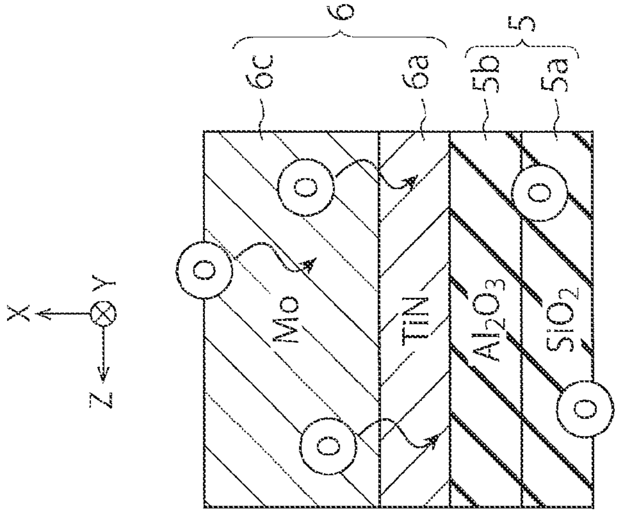

FIGS. 9A and 9B are cross-sectional views for describing an advantage of the semiconductor device of the first embodiment.

FIG. 9A illustrates the process in FIG. 6B or 6C of the comparative example. In the comparative example, if oxygen atoms are generated during the process in FIG. 6B or 6C, the oxygen atoms would enter, for example, the memory cell or the like from the electrode material layer 6*c*. As a result, properties of the three-dimensional semiconductor memory would be impaired by the oxygen atoms.

FIG. 9B illustrates the process in FIG. 7B or 7C of the present embodiment. The electrode layer 6 of the present embodiment includes the insulator 6*b* ($SiO_x$ film) between the barrier metal layer 6*a* and the electrode material layer 6*c*. Therefore, even if oxygen atoms are generated during the process in FIG. 7B or 7C, it is possible to reduce entry of the oxygen atoms from the electrode material layer 6*c* into the memory cell or the like by virtue of the insulator 6*b*. This makes it possible to reduce impairment of the properties of the three-dimensional semiconductor memory due to the oxygen atoms. This also applies to the process in FIG. 8B or 8C of the present embodiment.

Such oxygen atoms are generated due to, for example, a use of the source gas including molybdenum and oxygen. The present embodiment makes it possible to reduce impairment of the properties of the three-dimensional semiconductor memory due to the oxygen in the source gas. Regarding a metal element other than molybdenum, this also applies to formation of the electrode material layer 6*c* including the metal element using a source gas including the metal element and oxygen. An example of such a metal element is tungsten.

FIGS. 10A to 11B are cross-sectional views illustrating details of the method of manufacturing the semiconductor device of the first embodiment. FIGS. 10A to 11B illustrate details of the processes in FIGS. 4 and 5.

Figure 10B:
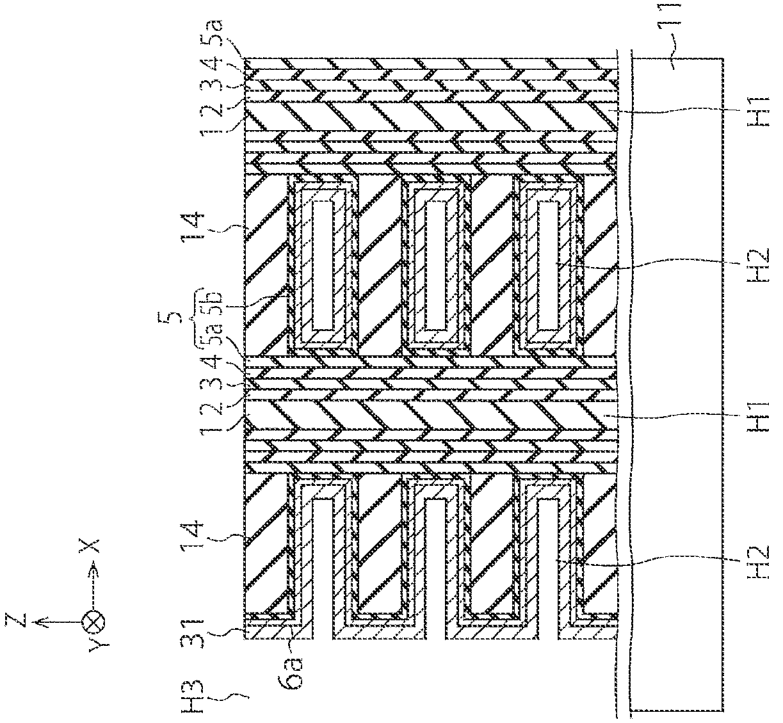
FIGS. 10A to 11B are cross-sectional views illustrating details of the method of manufacturing the semiconductor device of the first embodiment.
Figure 10A:
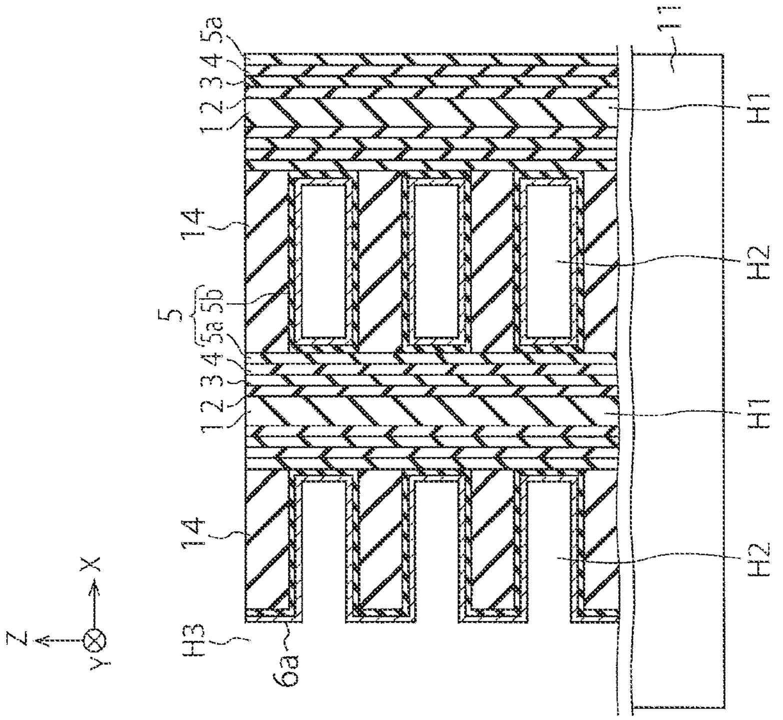

FIG. 10A illustrates the plurality of insulators 14 and the plurality of recesses H2 formed in the stacked film 12 as FIG. 4. FIG. 10A further illustrates a recess H3 formed in the stacked film 12. The recess H3 is one of the plurality of slits referred to in the description of FIG. 4.

First, the insulator 5*b* and the barrier metal layer 6*a* are sequentially formed on the surfaces of the insulators 5*a*, 14 exposed in the recesses H2, H3 (FIG. 10A). Next, the a-Si film 31 is formed on the surface of the barrier metal layer 6*a* (FIG. 10B). The a-Si film 31 is formed as in the process in FIG. 7A or 8A. A thickness of the a-Si film 31 is set, for example, in a range from 1 to 7 nm.

Figure 11A:
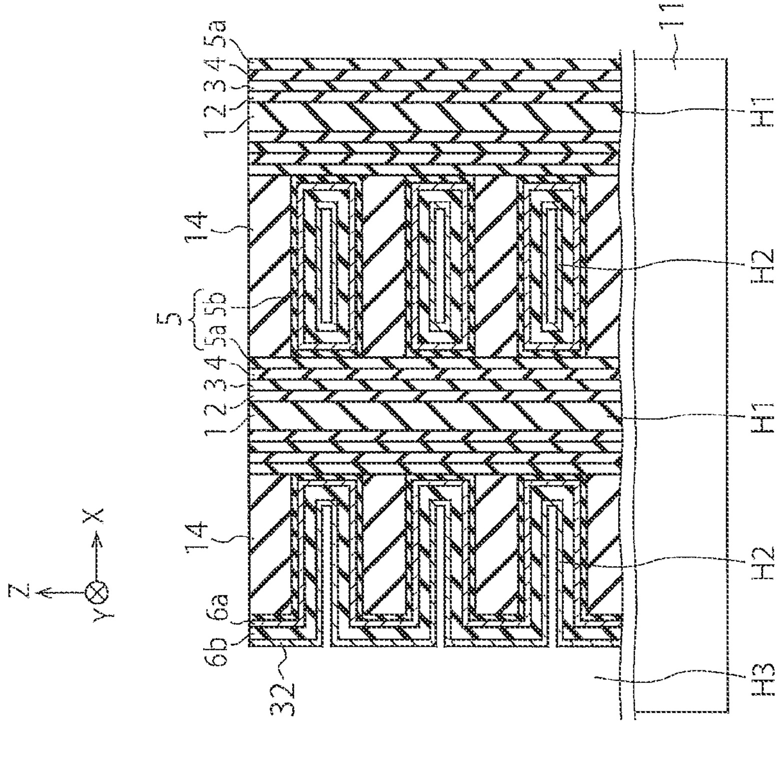

Next, Mo conversion is performed that changes at least a portion of the a-Si film 31 into the Mo film 32 (FIG. 11A). As a result, the portion of the a-Si film 31 is changed into the Mo film 32, and the remnant of the a-Si film 31 is changed into the insulator ($SiO_x$ film) 6*b*. This causes the insulator 6*b* to be formed on the surface of the barrier metal layer 6*a*, and the Mo film 32 to be formed on the surface of the insulator 6*b*. The Mo conversion is performed as in the process in FIG. 7B or 8B. A thickness of the Mo film 32 is set, for example, in a range from 3 to 5 nm.

Figure 11B:
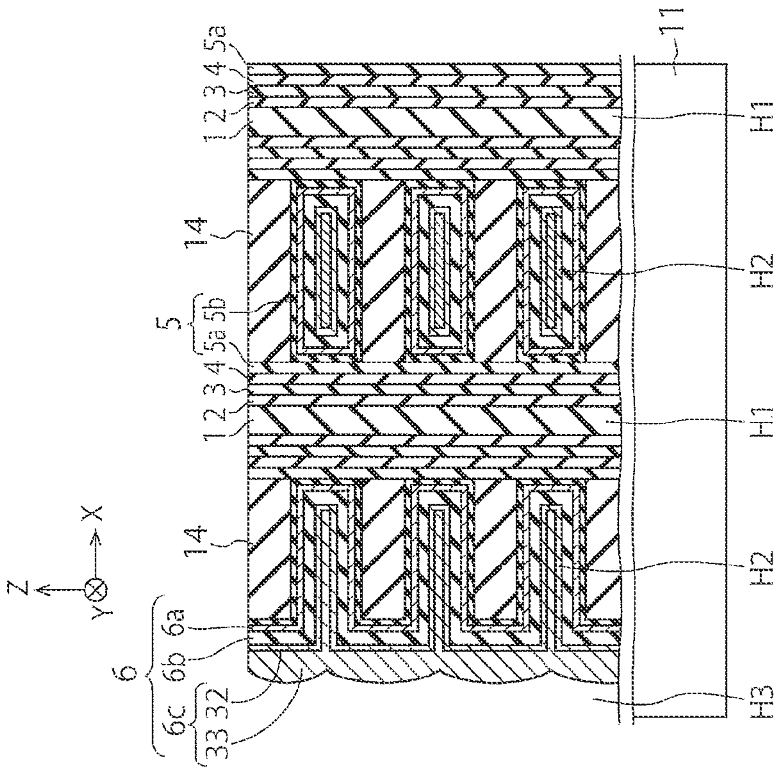

Next, the Mo film 33 is formed on the surface of the Mo film 32 (FIG. 11B). The Mo film 33 is formed as in the process in FIG. 7C or 8C.

Unnecessary portions of the insulator 5*b*, the barrier metal layer 6*a*, the insulator 6*b*, the Mo film 32, and the Mo film 33 are then removed from the recess H3. As a result, the electrode layer 6 is formed in each of the recesses H2 with the insulator 5*b* in between. The semiconductor device of the present embodiment is manufactured as described in the foregoing.

Figure 12B:
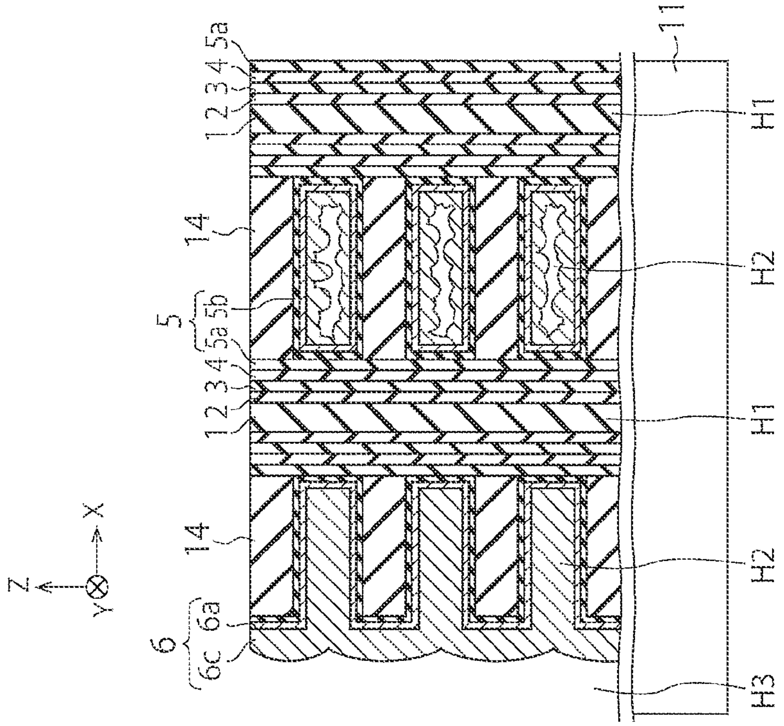
FIGS. 12A and 12B are cross-sectional views illustrating details of the method of manufacturing the semiconductor device of the comparative example of the first embodiment.
Figure 12A:
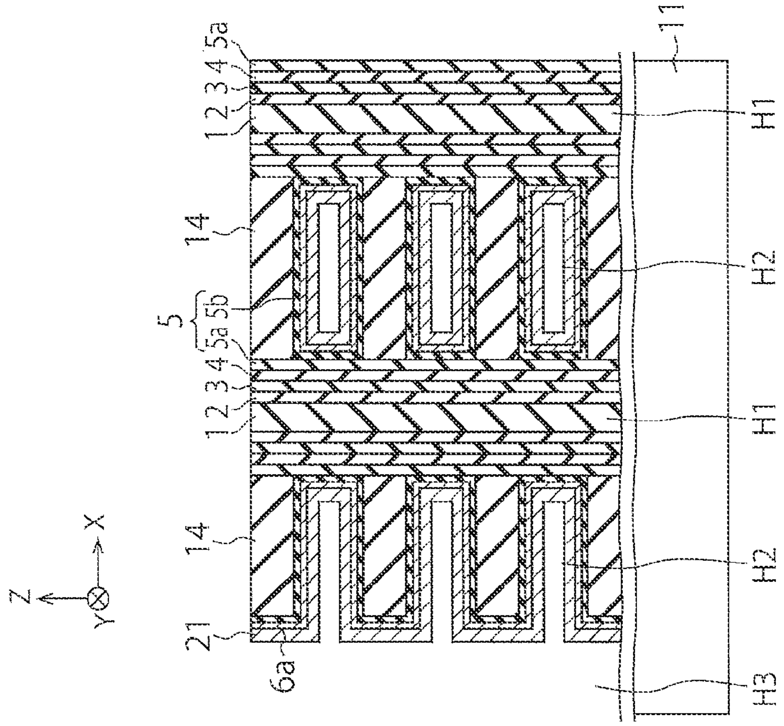

FIGS. 12A and 12B are cross-sectional views illustrating details of the method of manufacturing the semiconductor device of the comparative example of the first embodiment.

First, the insulator 5*b*, the barrier metal layer 6*a*, and the MON film 21 are sequentially formed on the surfaces of the insulators 5*a*, 14 exposed in the recesses H2, H3 (FIG. 12A). The MON film 21 is formed as in the process in FIG. 6A.

Next, the Mo conversion and the subsequent CVD cause the electrode material layer 6*c* (Mo film) to be formed on the surface of the barrier metal layer 6*a* (FIG. 12B). The Mo conversion and the subsequent CVD are performed as in the processes in FIGS. 6B and 6C. At this time, the MoN film 21 formed by the process in FIG. 12A is changed into an Mo film.

The electrode material layer 6*c* of the present comparative example is formed to have a worsened roughness. This causes a failure in embedding of the electrode material layer 6*c* in the recesses H2 in FIG. 12B. In contrast, the present embodiment makes it possible to improve a roughness of the electrode material layer 6*c*. This reduces a failure in embedding of the electrode material layer 6*c* in the recesses H2 in FIG. 11B.

As described hereinabove, the electrode layer 6 of the present embodiment is formed by changing the a-Si film 31 into the insulator 6*b* and the electrode material layer 6*c* and, as a result, includes the barrier metal layer 6*a*, the insulator 6*b*, and the electrode material layer 6*c*. Therefore, the present embodiment makes it possible to favorably form the electrode material layer 6*c* on the surface of the barrier metal layer 6*a* with the insulator 6*b* in between and form the favorable electrode layer 6. For example, an increase in particle size of the crystal particles in the electrode material layer 6*c* or an improvement in roughness of the electrode material layer 6*c* makes it possible to lower the electrical resistance of the electrode material layer 6*c*. This also applies to a case where the electrode material layer 6*c* is formed on the surface of the insulator 5*b* with the insulator 6*b* in between without formation of the barrier metal layer 6*a*.

Second Embodiment

Figure 13:
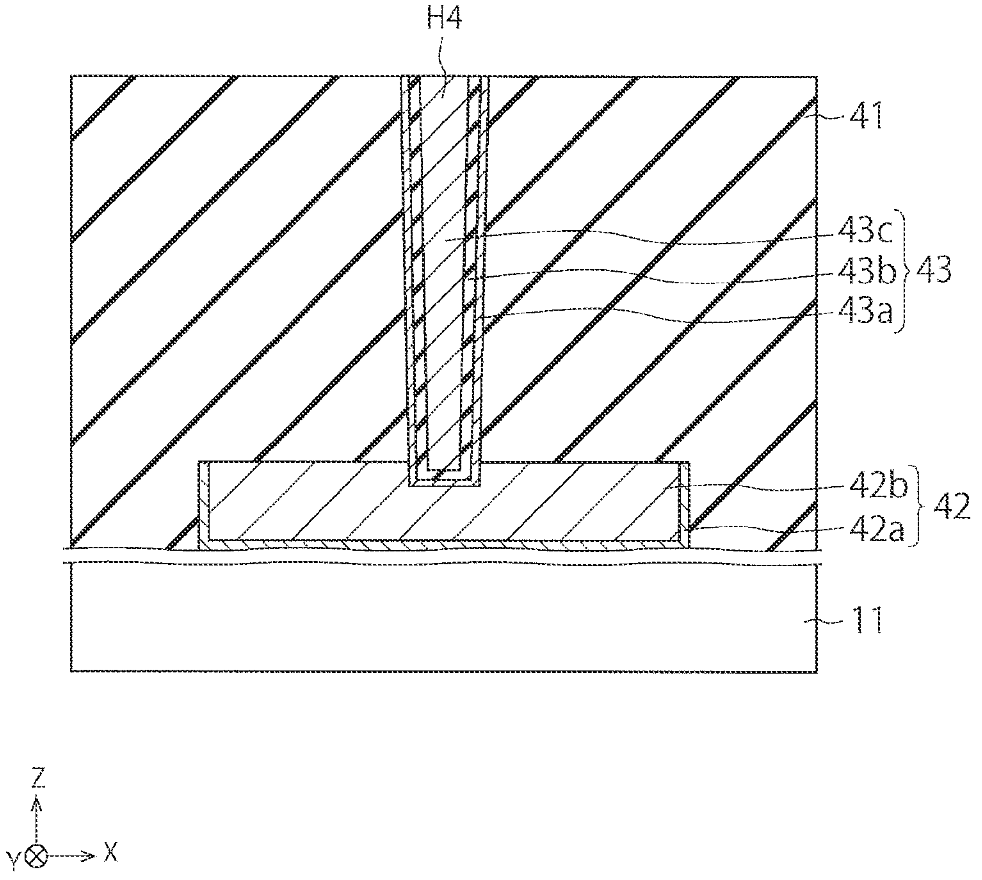
FIG. 13 is a cross-sectional view illustrating a structure of a semiconductor device of a second embodiment.

FIG. 13 is a cross-sectional view illustrating a structure of a semiconductor device of a second embodiment.

The semiconductor device of the present embodiment includes a substrate 11, an inter layer dielectric 41, an interconnect layer 42, and a via plug 43. The semiconductor device of the present embodiment may further include the structure in FIG. 1 or 5 on the substrate 11.

The inter layer dielectric 41 is formed on the substrate 11. The interconnect layer 42 is formed on the substrate 11 and covered by the inter layer dielectric 41. The interconnect layer 42 includes a barrier metal layer 42*a* and an interconnect material layer 42*b* in sequence. The via plug 43 is embedded in a via hole H4 formed in the inter layer dielectric 41 and disposed on the interconnect layer 42. The via plug 43 includes a barrier metal layer 43*a*, an insulator 43*b*, and a plug material layer 43*c* disposed in sequence in the via hole H4.

The barrier metal layer 43*a*, the insulator 43*b*, and the plug material layer 43*c* are, for example, a TiN film, an $SiO_x$ film, and an Mo film, respectively. The barrier metal layer 43*a*, the insulator 43*b*, and the plug material layer 43*c* may be formed as, for example, the barrier metal layer 6*a*, the insulator 6*b*, and the electrode material layer 6*c*, respectively, through the processes in FIGS. 7A to 7C or FIGS. 8A to 8C. This makes it possible to enjoy an advantage of the via plug 43 similar to that of the electrode layer 6. The via plug 43 is an example of the first interconnect layer and an example of a plug. The barrier metal layer 43*a*, the insulator 43*b*, and the plug material layer 43*c* are examples of the first layer, the first insulator, and the second layer, respectively.

Third Embodiment

Figure 14:
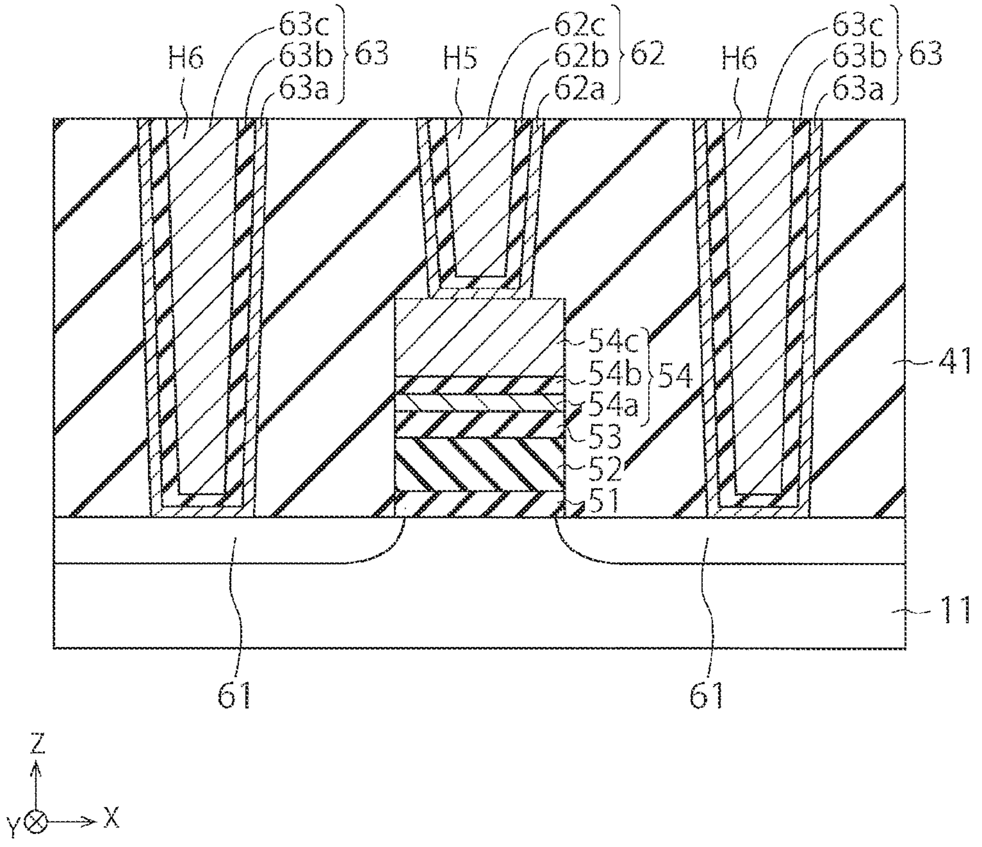
FIG. 14 is a cross-sectional view illustrating a structure of a semiconductor device of a third embodiment.

FIG. 14 is a cross-sectional view illustrating a structure of a semiconductor device of a third embodiment.

The semiconductor device of the present embodiment includes a substrate 11, an inter layer dielectric 41, a tunnel insulator 51, a charge storing layer 52, a block insulator 53, a control gate 54, a plurality of diffusing layers 61, a contact plug 62, and a plurality of contact plugs 63. The semiconductor device of the present embodiment may further include the structure in FIG. 1 or 5 on the substrate 11 and/or may include the structure in FIG. 13.

The inter layer dielectric 41 is formed on the substrate 11 as in the second embodiment. The tunnel insulator 51, the charge storing layer 52, the block insulator 53, and the control gate 54 are formed in sequence on the substrate 11 and provide a cell transistor of a planar semiconductor memory. The control gate 54 includes a barrier metal layer 54*a*, an insulator 54*b*, and an electrode material layer 54*c* formed in sequence on the block insulator 53. The plurality of diffusing layers 61, which are formed in the substrate 11, function as a source region and a drain region of the cell transistor.

The contact plug 62 is embedded in a contact hole H5 formed in the inter layer dielectric 41 and disposed on the control gate 54 (the electrode material layer 54*c*). The contact plug 62 includes a barrier metal layer 62*a*, an insulator 62*b*, and a plug material layer 62*c* disposed in sequence in the contact hole H5. The plurality of contact plugs 63 are embedded in a plurality of respective contact holes H6 formed in the inter layer dielectric 41 and disposed on the plurality of diffusing layers 61. The contact plugs 63 each include a barrier metal layer 63*a*, an insulator 63*b*, and a plug material layer 63*c* disposed in sequence in corresponding one of the contact holes H6.

The barrier metal layer 54*a*, the insulator 54*b*, and the electrode material layer 54*c* are, for example, a TiN film, an $SiO_x$ film, and an Mo film, respectively. The barrier metal layer 54*a*, the insulator 54*b*, and the electrode material layer 54*c* may be formed as, for example, the barrier metal layer 6*a*, the insulator 6*b*, and the electrode material layer 6*c*, respectively, through the processes in FIGS. 7A to 7C or FIGS. 8A to 8C. This makes it possible to enjoy an advantage of the control gate 54 similar to that of the electrode layer 6. The control gate 54 is an example of the first interconnect layer. The barrier metal layer 54*a*, the insulator 54*b*, and the electrode material layer 54*c* are examples of the first layer, the first insulator, and the second layer, respectively.

The barrier metal layer 62*a*, the insulator 62*b*, and the plug material layer 62*c* are, for example, a TiN film, an $SiO_x$ film, and an Mo film, respectively. The barrier metal layer 62*a*, the insulator 62*b*, and the plug material layer 62*c* may be formed as, for example, the barrier metal layer 6*a*, the insulator 6*b*, and the electrode material layer 6*c*, respectively, through the processes in FIGS. 7A to 7C or FIGS. 8A to 8C. This makes it possible to enjoy an advantage of the contact plug 62 similar to that of the electrode layer 6. The contact plug 62 is an example of the first interconnect layer and an example of the plug. The barrier metal layer 62*a*, the insulator 62*b*, and the plug material layer 62*c* are examples of the first layer, the first insulator, and the second layer, respectively.

The barrier metal layer 63*a*, the insulator 63*b*, and the plug material layer 63*c* are, for example, a TiN film, an $SiO_x$ film, and an Mo film, respectively. The barrier metal layer 63*a*, the insulator 63*b*, and the plug material layer 63*c* may be formed as, for example, the barrier metal layer 6*a*, the insulator 6*b*, and the electrode material layer 6*c*, respectively, through the processes in FIGS. 7A to 7C or FIGS. 8A to 8C. This makes it possible to enjoy an advantage of each of the contact plugs 63 similar to that of the electrode layer 6. Each of the contact plugs 63 is an example of the first interconnect layer and an example of the plug. The barrier metal layer 63*a*, the insulator 63*b*, and the plug material layer 63*c* are examples of the first layer, the first insulator, and the second layer, respectively.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:

a stacked film including a plurality of electrode layers and a plurality of insulators that are alternately provided in a first direction; and a second insulator provided in direct contact with the stacked film in the stacked film;

a charge storing layer provided on a side face of the second insulator in the stacked film;

a third insulator provided on a side face of the storing layer in the stacked film; and a semiconductor layer provided on a side face of the third insulator in the stacked film, wherein at least one of the plurality of electrode layers includes:

a first layer that is provided on a side face of the second insulator via a fourth insulator included in the stacked film, and includes a metal element, the fourth insulator being in direct contact with the second insulator, the first layer being in direct contact with the fourth insulator;

a first insulator that is in contact with the first layer and includes silicon and oxygen; and a second layer that is in contact with the first insulator and includes molybdenum or tungsten.

2. The device of claim 1, wherein the first layer is a conductor layer including titanium as the metal element.

3. The device of claim 1, wherein the first insulator is an $SiO_x$ film where Si denotes silicon, O denotes oxygen, and "x" is a real number satisfying 0<"x"<2.

4. The device of claim 1, wherein a concentration of oxygen atoms in the first insulator is 5.0×1021 to 5.0×1023 atoms/cm3.

5. The device of claim 1, wherein a thickness of the first insulator is 7 nm or less.

6. A semiconductor device comprising:

a stacked film including a plurality of electrode layers and a plurality of insulators that are alternately provided in a first direction; and a second insulator provided in direct contact with the stacked film in the stacked film;

a charge storing layer provided on a side face of the second insulator in the stacked film;

a third insulator provided on a side face of the storing layer in the stacked film; and a semiconductor layer provided on a side face of the third insulator in the stacked film, wherein at least one of the plurality of electrode layers includes:

a first layer that is provided on a side face of the second insulator via a fourth insulator included in the stacked film, and includes a first metal element, the fourth insulator being in direct contact with the second insulator, the first layer being in direct contact with the fourth insulator;

a first insulator that is in contact with the first layer and includes silicon and oxygen; and a second layer that is in contact with the first insulator and includes a second metal element.

7. The device of claim 6, wherein the second metal element is different from the first metal element.

8. The device of claim 6, wherein the second metal element is molybdenum or tungsten.

9. A method of manufacturing a semiconductor device, comprising:

forming a stacked film including a plurality of fourth layers and a plurality of insulators that are alternately provided in a first direction; and forming a second insulator in direct contact with the stacked film in the stacked film;

forming a charge storing layer on a side face of the second insulator in the stacked film;

forming a third insulator on a side face of the storing layer in the stacked film;

forming a semiconductor layer on a side face of the third insulator in the stacked film;

removing the plurality of fourth layers from the stacked film after the semiconductor layer is formed; and forming a plurality of electrode layers in a plurality of recesses formed in the stacked film by the removal of the plurality of fourth layers, wherein at least one of the plurality of electrode layers is formed by:

forming a first layer that is provided on a side face of the second insulator via a fourth insulator included in the stacked film, and includes a metal element, the fourth insulator being in direct contact with the second insulator, the first layer being in direct contact with the fourth insulator;

forming a first film that is in contact with the first layer and includes silicon;

changing the first film into a first insulator that is in contact with the first layer and includes silicon and oxygen, and a second film that is in contact with the first insulator and includes molybdenum or tungsten; and forming a third film that is in contact with the second film and includes molybdenum or tungsten, thereby forming a second layer including the second film and the third film.

10. The method of claim 9, wherein the first film is an amorphous film.

11. The method of claim 9, wherein a thickness of the first film is 7 nm or less.

12. The method of claim 9, wherein a first gas including molybdenum or tungsten is used to change the first film into the first insulator and the second film.

13. The method of claim 12, wherein the first gas includes molybdenum or tungsten, and oxygen.

14. The method of claim 13, wherein the first gas includes an $MoO_2Cl_2$ gas, an $MoOCl_4$ gas, a $WO_2Cl_2$ gas or a $WOCl_4$ gas where Mo denotes molybdenum, W denotes tungsten, O denotes oxygen, and Cl denotes chlorine.

15. The method of claim 9, wherein the first film is changed into the first insulator and the second film that includes molybdenum at 600° C. or less.

16. The method of claim 9, wherein the first film is changed into the first insulator and the second film that includes tungsten at 400 to 500° C.

* * * * *